(12) United States Patent
Nakamori et al.

(10) Patent No.: US 7,706,491 B2
(45) Date of Patent: Apr. 27, 2010

(54) MOBILE COMMUNICATION TERMINAL

(75) Inventors: Takeshi Nakamori, Yokohama (JP);
Shinsuke Ogawa, Yokohama (JP);
Yousuke Iizuka, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 959 days.

(21) Appl. No.: 11/371,102

(22) Filed: Mar. 9, 2006

(65) Prior Publication Data
US 2006/0218457 A1    Sep. 28, 2006

(30) Foreign Application Priority Data
Mar. 14, 2005    (JP) .......................... P2005-071336

(51) Int. Cl.
*H04L 7/00* (2006.01)
(52) U.S. Cl. .................................... 375/355
(58) Field of Classification Search ............... 375/354, 375/355, 358, 362, 371
See application file for complete search history.

(56) References Cited

U.S. PATENT DOCUMENTS

| | | | | |
|---|---|---|---|---|
| 3,163,715 | A | * | 12/1964 | Teramura et al. .......... 178/23 R |
| 2004/0196937 | A1 | * | 10/2004 | Wang et al. ................. 375/355 |
| 2005/0204252 | A1 | * | 9/2005 | Aramaki et al. ............ 714/748 |
| 2008/0010577 | A1 | * | 1/2008 | Chernyshev et al. ........ 714/748 |

FOREIGN PATENT DOCUMENTS

| | | |
|---|---|---|
| EP | 0 757 458 A2 | 2/1997 |
| JP | 07-154441 | 6/1995 |
| JP | 07-319577 | 12/1995 |
| JP | 09-153887 | 6/1997 |
| JP | 2001-156866 | 6/2001 |
| JP | 2001-257731 | 9/2001 |
| JP | 3252820 | 11/2001 |
| JP | 2003-051764 | 2/2003 |
| JP | 2004-165929 | 6/2004 |

OTHER PUBLICATIONS

U.S. Appl. No. 11/372,067, filed Mar. 10, 2006, Nakamori, et al.
European Patent Application Laid-Open No. EP0757458.

* cited by examiner

*Primary Examiner*—Chieh M. Fan
*Assistant Examiner*—Freshteh N Aghdam
(74) *Attorney, Agent, or Firm*—Oblon, Spivak, McClelland, Maier & Neustadt, L.L.P.

(57) ABSTRACT

The packet reception section of the cellular phone receives a packet transmitted from the base station and the transmission error detection section detects a transmission error of the received packet. When the transmission error is detected, the retransmission request transmission section transmits a retransmission request to request the retransmission of the packet in which the transmission error is detected, to the base station, and the sample timing control section shifts the sample timing of the A/D converter by a half clock.

6 Claims, 9 Drawing Sheets

MOBILE COMMUNICATION TERMINAL

BACKGROUND OF THE INVENTION

1. Field of the Invention

The present invention relates to a mobile communication terminal having an A/D converter.

2. Related Background Art

In mobile communication terminals such as cellular phones, packets (analog signals) received from a base station are generally sampled and converted to digital signals by means of an A/D converter. Such mobile communication terminals are able to obtain an optimum reception characteristic when sampling is performed in the maximum amplitude position of the received analog signal.

Technology relating to sampling by means of an A/D converter is disclosed in, for example, Japanese Patent Application Laid-Open Gazette No. 2004-165929.

SUMMARY OF THE INVENTION

Further, the sample timing of the A/D converter of the mobile communication terminal may generate an error as a result of the effects of variations in the reception environment and so forth. Furthermore, the reception characteristic deteriorates as the error generated by the sample timing increases.

Here, even when an error is generated in the sample timing, the probability of sampling in the vicinity of the maximum amplitude position of the analog signal can be increased by increasing the sample timing (raising the operating speed of the sampling). That is, by increasing the sample timing, a favorable reception characteristic can be maintained. However, the power consumption increases as the sample timing is increased.

Therefore, in order to solve the above problem, an object of the present invention is to provide a mobile communication terminal that makes it possible to improve the sampling efficiency of the A/D converter while suppressing the power consumption.

The mobile communication terminal of the present invention comprises receiving means for receiving an analog signal; transmission error detecting means for detecting a transmission error of the analog signal received by the receiving means; retransmission request transmitting means that, when the transmission error is detected by the transmission error detecting means, transmits a retransmission request to request retransmission of the analog signal in which the transmission error is detected; and sample timing controlling means for controlling the sample timing of an A/D converter for converting the analog signal into a digital signal, wherein the sample timing controlling means shifts the sample timing of the A/D converter by a half clock when the retransmission request has been transmitted by the retransmission request transmitting means.

According to the present invention, a retransmission request can be transmitted when a transmission error is detected in the received analog signal and the sample timing of the A/D converter can be shifted by a half clock when the transmission request is transmitted. As a result, results similar to those obtained when the sample timing of the analog signal transmitted in response to a retransmission request is substantially doubled can be obtained without increasing the sample timing. Therefore, the efficiency of the sampling of the A/D converter can be improved while suppressing the power consumption.

The mobile communication terminal of the present invention comprises receiving means for receiving an analog signal; modulation system discriminating means for discriminating the modulation system of the analog signal received by the receiving means; transmission error detecting means for detecting a transmission error of the analog signal received by the receiving means; retransmission request transmitting means that, when the transmission error is detected by the transmission error detecting means, transmits a retransmission request to request retransmission of the analog signal in which the transmission error is detected; and sample timing controlling means for controlling the sample timing of an A/D converter for converting the analog signal into a digital signal, wherein the sample timing controlling means shifts the sample timing of the A/D converter by a half clock when the analog signal retransmitted in response to the retransmission request is an analog signal the modulation system of which is discriminated as quadrature amplitude modulation by the modulation system discriminating means. Further, the quadrature amplitude modulation is preferably 16QAM.

According to the present invention, the modulation system for received analog signals can be distinguished and, when a transmission error is detected in a received analog signal, a retransmission request can be transmitted. Further, when the analog signal that has been transmitted in response to the retransmission request is modulated by quadrature amplitude modulation, the sample timing of the A/D converter can be shifted by a half clock. As a result, when the analog signal that has been modulated by quadrature amplitude modulation has been retransmitted, results similar to those obtained when the sample timing of the retransmitted analog signal is substantially doubled can be obtained without increasing the sample timing. Therefore, the efficiency of the sampling of the A/D converter can be improved while suppressing the power consumption.

The mobile communication terminal of the present invention comprises receiving means for receiving an analog signal; data size judging means for judging whether the data size of the analog signal received by the receiving means exceeds a predetermined threshold value; transmission error detecting means for detecting a transmission error of the analog signal received by the receiving means; retransmission request transmitting means that, when the transmission error is detected by the transmission error detecting means, transmits a retransmission request to request retransmission of the analog signal in which the transmission error is detected; and sample timing controlling means for controlling the sample timing of an A/D converter for converting the analog signal into a digital signal, wherein the sample timing controlling means shifts the sample timing of the A/D converter by a half clock when the analog signal retransmitted in response to the retransmission request is an analog signal the data size of which is judged to exceed the predetermined threshold value by the data size judging means.

According to the present invention, it can be discriminated whether the data size of a received analog signal exceeds a threshold value, and a retransmission request can be transmitted when a transmission error is detected in the received analog signal. Further, when the data size of the analog signal that has been transmitted in response to the retransmission request exceeds the predetermined threshold value, the sample timing of the A/D converter can be shifted by a half clock. As a result, when an analog signal the data size of which exceeds the threshold value has been retransmitted, results similar to those obtained when the sample timing of the retransmitted analog signal is substantially doubled can be obtained without increasing the sample timing. Therefore, the efficiency of the sampling of the A/D converter can be improved while suppressing the power consumption.

The mobile communication terminal of the present invention comprises receiving means for receiving an analog signal; modulation system discriminating means for discriminating the modulation system of the analog signal received by the receiving means; data size judging means for judging whether the data size of the analog signal received by the receiving means exceeds a predetermined threshold value; transmission error detecting means for detecting a transmission error of the analog signal received by the receiving means; retransmission request transmitting means that, when the transmission error is detected by the transmission error detecting means, transmits a retransmission request to request retransmission of the analog signal in which the transmission error is detected; and sample timing controlling means for controlling the sample timing of an A/D converter for converting the analog signal into a digital signal, wherein the sample timing controlling means shifts the sample timing of the A/D converter by a half clock when the analog signal retransmitted in response to the retransmission request is an analog signal the modulation system of which is discriminated as quadrature amplitude modulation by the modulation system discriminating means and is an analog signal the data size of which is judged to exceed the predetermined threshold value by the data size judging means. Further, the quadrature amplitude modulation is preferably 16 QAM.

According to the present invention, the modulation system of the received analog signal can be discriminated, and it can be discriminated whether the data size of the received analog signal exceeds a threshold value. Further, a retransmission request can be transmitted when a transmission error is detected in the received analog signal. Further, the sample timing of the A/D converter can be shifted by a half clock when the analog signal transmitted in response to the retransmission request is modulated by quadrature amplitude modulation and the data size of the analog signal exceeds the threshold value. As a result, when an analog signal that has been modulated by quadrature amplitude modulation and the data size of which exceeds the threshold value has been retransmitted, results similar to those obtained when the sample timing of the retransmitted analog signal is substantially doubled can be obtained without increasing the sample timing. Therefore, the efficiency of the sampling of the A/D converter can be improved while suppressing the power consumption.

The mobile communication terminal of the present invention comprises receiving means for receiving an analog signal; transmission error detecting means for detecting a transmission error of the analog signal received by the receiving means; and sample timing controlling means for controlling the sample timing of an A/D converter for converting the analog signal into a digital signal, wherein the sample timing controlling means shifts the sample timing of the A/D converter by a half clock when the transmission error is detected by the transmission error detecting means.

According to the present invention, the sample timing of the A/D converter can be shifted by a half clock when a transmission error of the received analog signal is detected. By shifting the sample timing by a half clock when a transmission error has been generated due to an error in the sample timing, for example, sample timing errors can be reduced without increasing the sample timing. Therefore, the efficiency of the sampling of the A/D converter can be improved while suppressing the power consumption.

According to the mobile communication terminal of the present invention, the sample timing controlling means preferably shift the sample timing of the A/D converter by a half clock when a transmission error is detected a predetermined number of consecutive times. Further, the mobile communication terminal of the present invention preferably further comprises transmission error rate calculating means that calculate a transmission error rate on the basis of the result of transmission error detection by the transmission error detecting means, wherein the sample timing controlling means preferably shift the sample timing of the A/D converter by a half clock when the transmission error rate calculated by the transmission error rate calculating means exceeds a predetermined threshold value.

The mobile communication terminal of the present invention is capable of improving the efficiency of the sampling of the A/D converter while suppressing the power consumption.

DESCRIPTION OF THE PREFERRED EMBODIMENTS

Embodiments of the mobile communication terminal of the present invention will be described hereinbelow on the basis of the drawings.

First Embodiment

First, the first embodiment of the present invention will be described. The cellular phone of this embodiment contains a high-speed wireless communication function using HSDPA (high speed downlink packet access), for example, and implements high-speed wireless communications by increasing the frequency usage efficiency by using a high-rate error correction code, or multivalued modulation, such as 16QAM (Quadrature Amplitude Modulation) or 64QAM.

Figure 1:
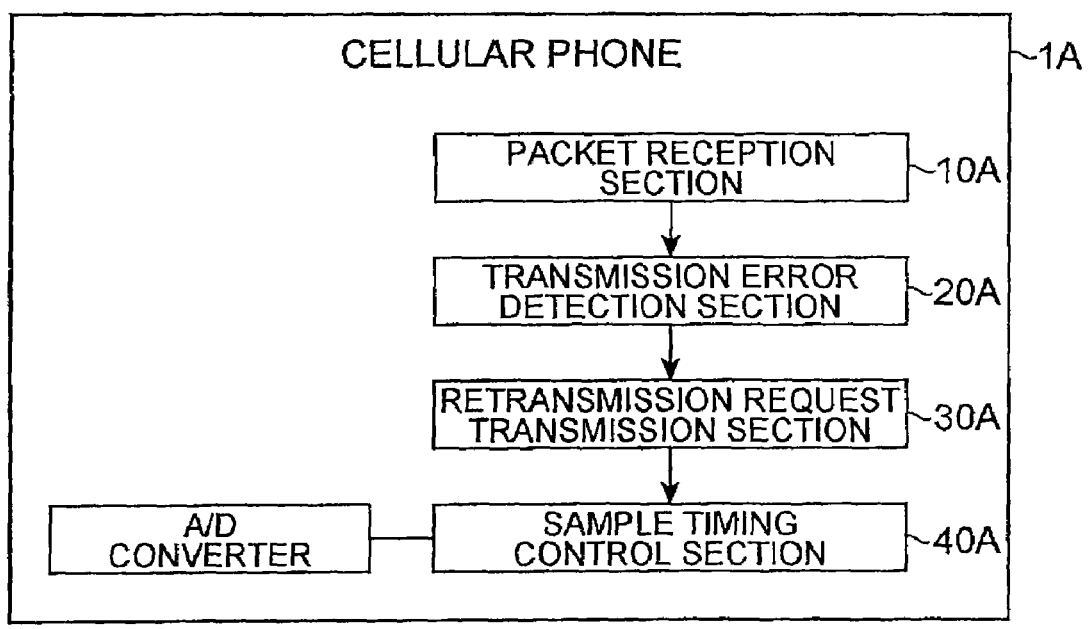
FIG. 1 is a block diagram showing the functional constitution of a cellular phone of a first embodiment.

FIG. 1 illustrates the functional constitution of a cellular phone 1A of the first embodiment. As shown in FIG. 1, the cellular phone 1A comprises a packet reception section 10A, a transmission error detection section 20A, a retransmission request transmission section 30A, and a sample timing control section 40A.

The packet reception section 10A receives packets (analog signals) transmitted from the base station.

The transmission error detection section 20A detects the transmission errors of packets received by the packet reception section 10A. In this embodiment, a CRC (Cyclic Redundancy Check) is adopted as the transmission error detection system. Further, the transmission error detection system is not limited to CRC. Other transmission error detection systems such as a parity check, for example, may also be adopted.

When a transmission error is detected by the transmission error detection section 20A, the retransmission request transmission section 30A transmits a retransmission request to the base station to request the retransmission of packets in which the transmission error is detected.

The sample timing control section 40A shifts the sample timing of the A/D converter by a half clock when a retransmission request is transmitted by the retransmission request transmission section 30A. Further, the A/D converter is a commonly known A/D converter that converts analog signals into digital signals.

Figure 2:
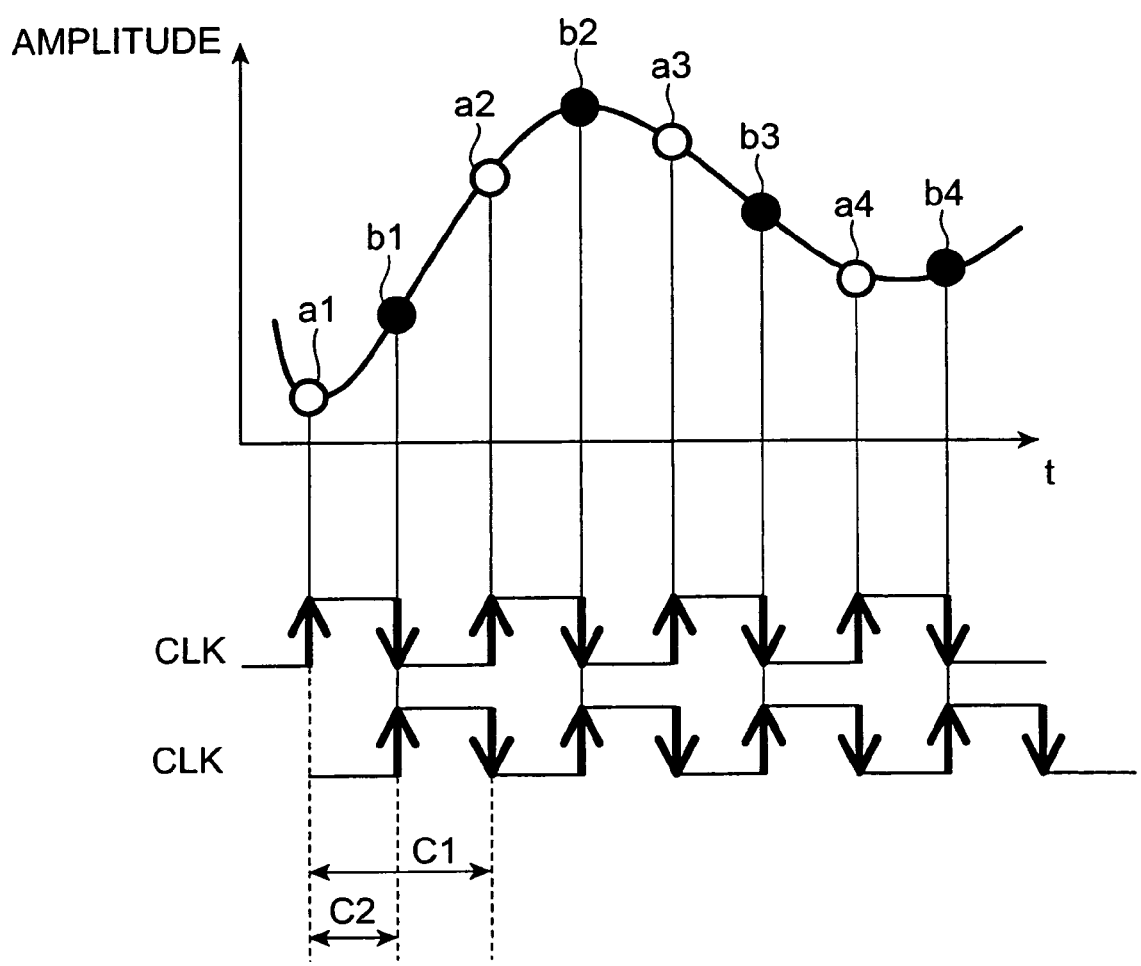
FIG. 2 is an illustration for introduction to sample timing in an A/D converter.

Here, the sample timing of the A/D converter will be described with reference to FIG. 2. The horizontal axis shown in FIG. 2 represents time [t] and the vertical axis represents the amplitude of the analog signal. The normal sample timing is at four points a1 to a4, which are sampled at the leading edge of the clock CLK. On the other hand, the sample timing when the sample timings a1 to a4 are shifted by a half clock are the four points b1 to b4, which are sampled at the trailing edge of the clock CLK. When the sample timings a1 to a4 and sample timings b1 to b4 are put together, a total of eight sample-timings are generated. Further, an interval C1 between the sample timing a1 and sample timing a2 is a sampling cycle, that is, one clock, and an interval C2 between the sample timing a1 and sample timing b1 is half the sampling cycle, that is, a half clock.

Generally, the transmission timing for packets that are retransmitted due to a transmission error is such that the packets are transmitted with the same timing as the transmission timing of packets prior to retransmission. This is because sample timing error generation often has a fixed cycle and the cycle is longer than the time required for retransmission and it is therefore rare that the sample timing will shift during retransmission. Therefore, by shifting the sample timing of the retransmitted packet by a half clock from the sample timing prior to retransmission, the retransmitted packet can be sampled with sample timing of substantially eight points. That is, a reception characteristic similar to that obtained when the sample number is substantially doubled can be obtained without changing the sample number.

As a result, as shown in FIG. 2, for example, when sampling is performed with sample timings a1 to a4, because sample points in the vicinity of the maximum amplitude position are lost due to errors generated in the sample timing, the probability that errors will be generated in the packet and retransmitted in this case increases. However, even when an error is retransmitted, the sample timing error is canceled by performing sampling with the sample timing b1 to b4 following retransmission and, because the sample timing b2 makes it possible to substantially grasp the maximum amplitude position, an optimum reception characteristic can be obtained in this case.

Here, the shifting of the sample timing following transmission by a half clock serves to allow the sample timing following transmission to be timing that is the farthest from the sample timing prior to retransmission. That is, by setting sample timing with a minimal correlation prior to transmission and following transmission, the reception characteristic following transmission can be made preferable even when the reception characteristic prior to retransmission is poor. As a result, because the reception characteristic can be improved without changing the sample number, the sampling efficiency improves.

Figure 3:
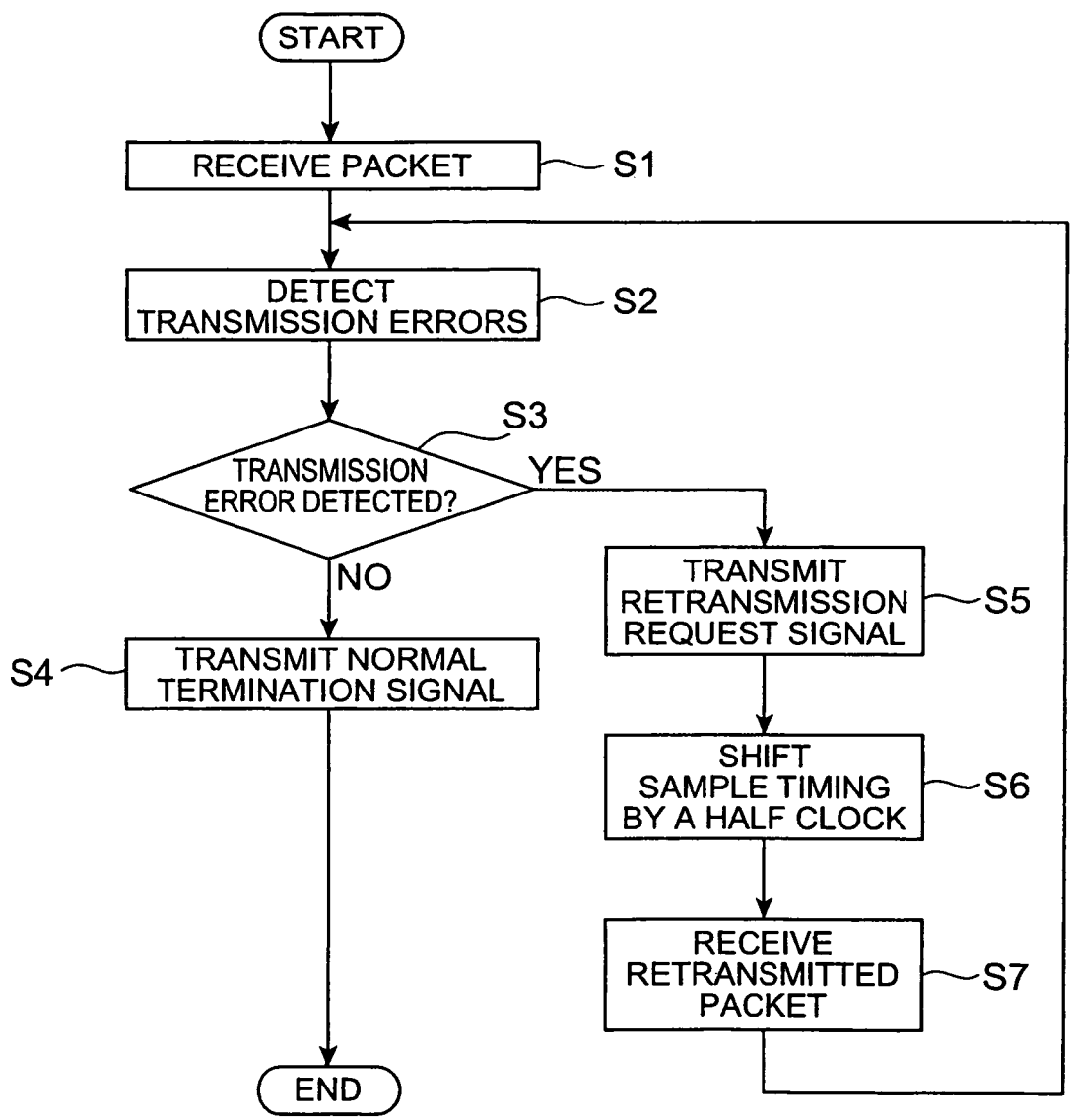
FIG. 3 is a flowchart that serves to illustrate the sample timing control processing of the cellular phone of the first embodiment.

Sample timing control processing for one packet of the cellular phone 1A of the first embodiment will be described next with reference to FIG. 3.

First, the packet reception section 10A of the cellular phone 1A receives packets that have been transmitted from the base station (step S1).

Thereafter, the transmission error detection section 20A detects transmission errors of packets received by the packet reception section 10A (step S2) and, when a transmission error is not detected as a result of the detection (step S3; NO), the transmission error detection section 20A transmits a normal termination signal indicating that packet reception was terminated normally to the base station (step S4) and ends the sample timing control processing.

On the other hand, when a transmission error is detected by the transmission error detection section 20A (step S3; YES), the retransmission request transmission section 30A transmits a retransmission request to request retransmission of the packet in which the transmission error is detected to the base station (step S5).

Thereafter, the sample timing control section 40A shifts the sample timing of the A/D converter by a half clock (step S6). Further, when the packet has been retransmitted by the base station, the retransmitted packet is received (step S7) and the processing moves to step S2.

As a result, irrespective of the packet retransmission reception conditions, a reception characteristic similar to that in a case where the sample timing is substantially doubled can be obtained without increasing the sample timing for the retransmitted packet. Hence, the efficiency of the sampling of the A/D converter can be improved while suppressing the power consumption.

Second Embodiment

The second embodiment of the present invention will be described next. The cellular phone of the second embodiment differs from the cellular phone of the first embodiment, as follows. In the case of the cellular phone of the first embodiment, the sample timing is shifted by a half clock when a transmission error is detected and a retransmission request is transmitted. However, the cellular phone of the second embodiment differs in that the sample timing is shifted by a half clock, when a packet that has been modulated by means of quadrature amplitude modulation such as 16QAM, has been retransmitted.

Figure 4:
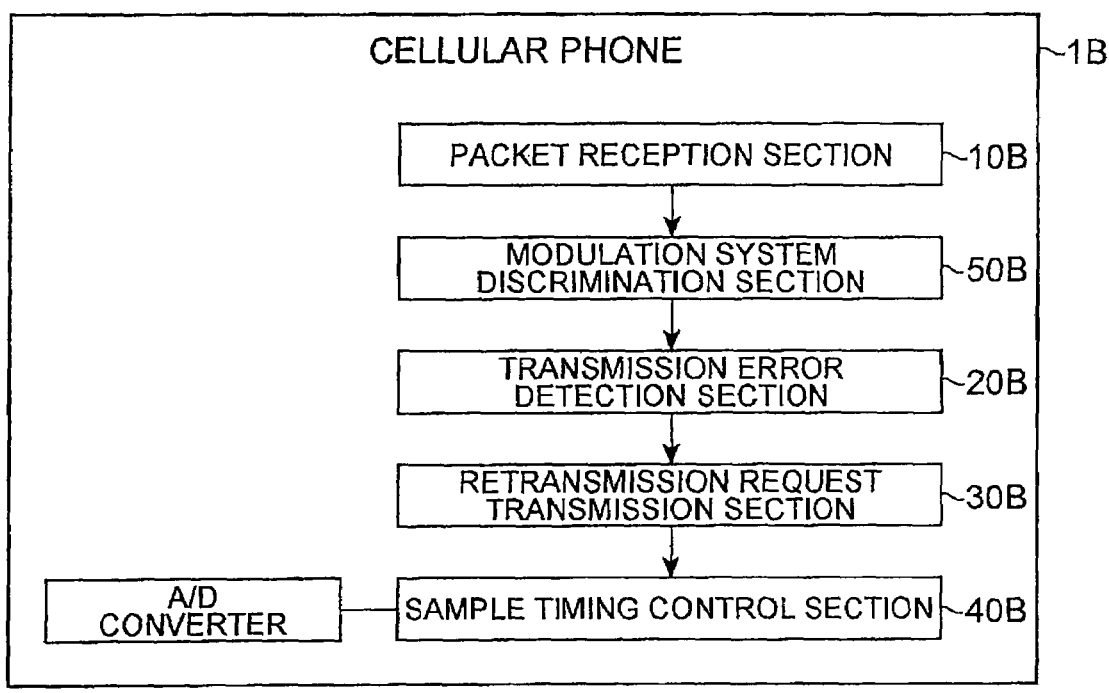
FIG. 4 is a block diagram showing the functional constitution of a cellular phone of a second embodiment.

First, the functional constitution of a cellular phone 1B of the second embodiment will be described with reference to FIG. 4. As shown in FIG. 4, the cellular phone 1B of the second embodiment comprises a packet reception section 10B, a modulation system discrimination section 50B, a transmission error detection section 20B, a retransmission request transmission section 30B, and a sample timing control section 40B. Because the packet reception section 10B, transmission error detection section 20B, and retransmission request transmission section 30B have the same functions as those of the packet reception section 10A, transmission error detection section 20A, and retransmission request transmission section 30A of the first embodiment, the description of these sections will be omitted.

The modulation system discrimination section 50B discriminates the modulation system for packets received by the packet reception section 10B. Applicable modulation systems include, for example, QPSK (Quadrature Phase Shift Keying), OFDM (Orthogonal Frequency Division Multiplexing), 16QAM, and 64QAM. The packet modulation system is contained in the control signal relayed by the base station and the modulation system discrimination section 50B discriminates the packet modulation system on the basis of the control signal relayed by the base station.

The sample timing control section 40B shifts the sample timing of the A/D converter by a half clock when a packet that has been retransmitted in response to a retransmission request is a packet whose modulation system is discriminated by the modulation system discrimination section 50B as 16QAM. Further, the modulation system is not limited to 16QAM and may be other quadrature amplitude modulation such as 64QAM. That is, generally, quadrature amplitude modulation is a modulation system that is used when performing high-speed digital communications. Therefore, when performing high-speed digital communications, the sample timing of a retransmitted packet may be shifted by a half clock.

Figure 5:
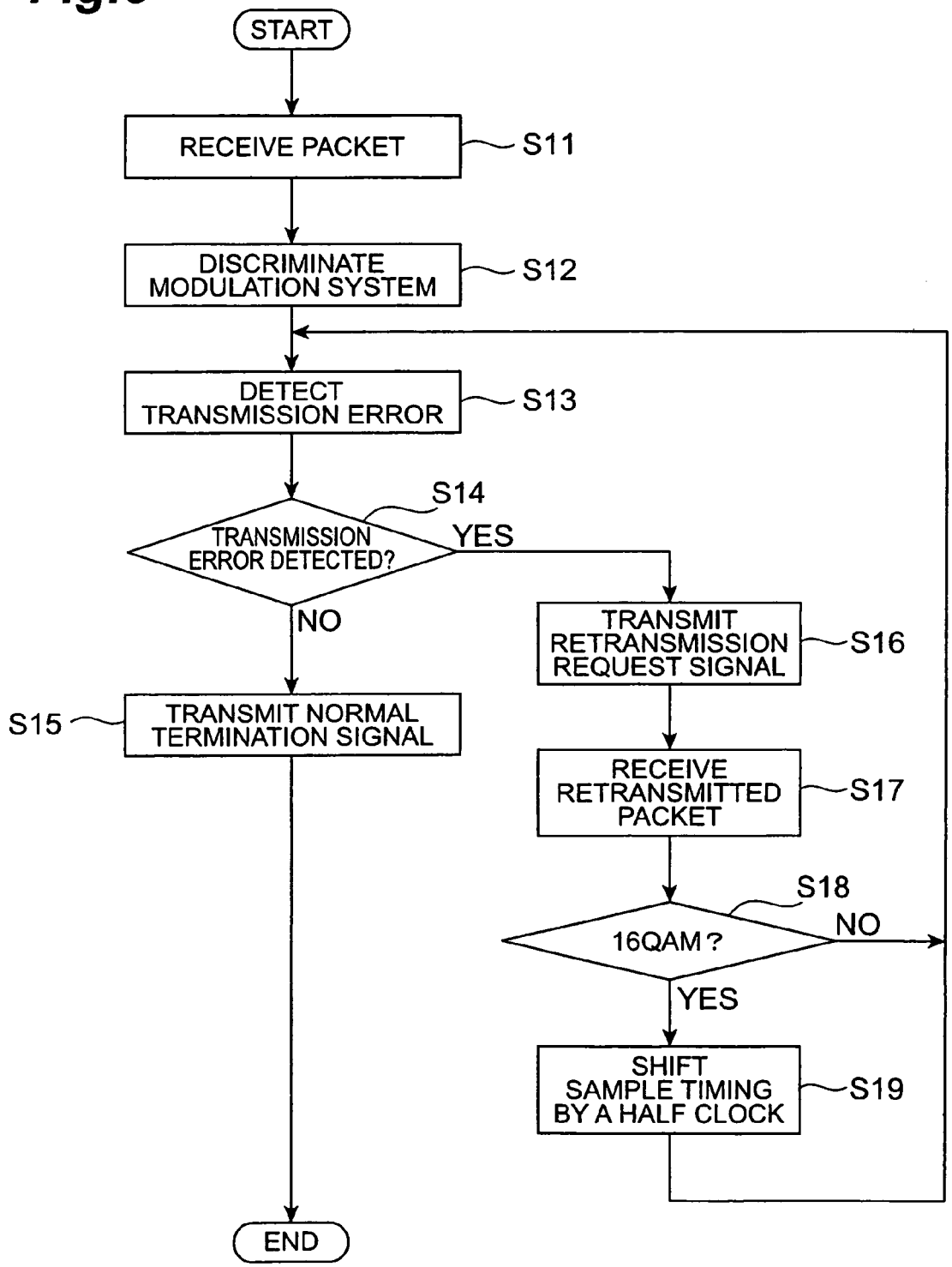
FIG. 5 is a flowchart that serves to illustrate the sample timing control processing of the cellular phone of the second embodiment.

The sample timing control processing of one packet of the cellular phone 1B of the second embodiment will be described next with reference to FIG. 5.

First, the packet reception section 10B of the cellular phone 1B receives a packet transmitted by the base station (step S11).

Thereafter, the modulation system discrimination section 50B discriminates the modulation system of the packet received by the packet reception section 10B (step S12) and stores the discrimination result in the memory of the cellular phone 1B.

The transmission error detection section 20B then detects transmission errors in the packet received by the packet reception section 10B (step S13) and, when a transmission error is not detected as a result (step S14; NO), the transmission error detection section 20B transmits a normal termination signal indicating that the reception of the packet was terminated normally to the base station (step S15) and ends the sample timing control processing.

On the other hand, when a transmission error is detected by the transmission error detection section 20B (step S14; YES), the retransmission request transmission section 30B transmits a retransmission request to request the retransmission of the packet in which a transmission error is detected to the base station (step S16). As a result, the packet is retransmitted by the base station and the cellular phone 1B receives the retransmitted packet (step S17).

Thereafter, the sample timing control section 40B judges whether the modulation system of the packet that has been retransmitted in response to the retransmission request is 16QAM by referencing the memory (step S18). When the judgment is NO (step S18; NO), the processing moves to step S13.

On the other hand, when it is judged in step S18 that the modulation system is 16QAM (step S18; YES), the sample timing control section 40B shifts the sample timing of the A/D converter by a half clock (step S19). The processing then moves to step S13.

As a result, when a packet that has been modulated using 16QAM is retransmitted, the sample timing of the packet can be substantially doubled. Hence, a packet is transmitted by means of a modulation system that is used when performing high-speed digital communications and, irrespective of the retransmission reception conditions, a reception characteristic similar to that in a case where sampling is performed by doubling the sample timing can be obtained without increasing the sample timing. Hence, the efficiency of the sampling of the A/D converter can be improved while suppressing the power consumption.

Third Embodiment

The third embodiment of the present invention will be described next. The cellular phone of the third embodiment differs from the cellular phone of the first embodiment, as follows. In the case of the cellular phone of the first embodiment, the sample timing is shifted by a half clock when a transmission error is detected and a retransmission request is transmitted. However, the cellular phone of the third embodiment differs in that the sample timing is shifted by a half clock when a packet that exceeds the threshold value of the data size has been retransmitted.

Figure 6:
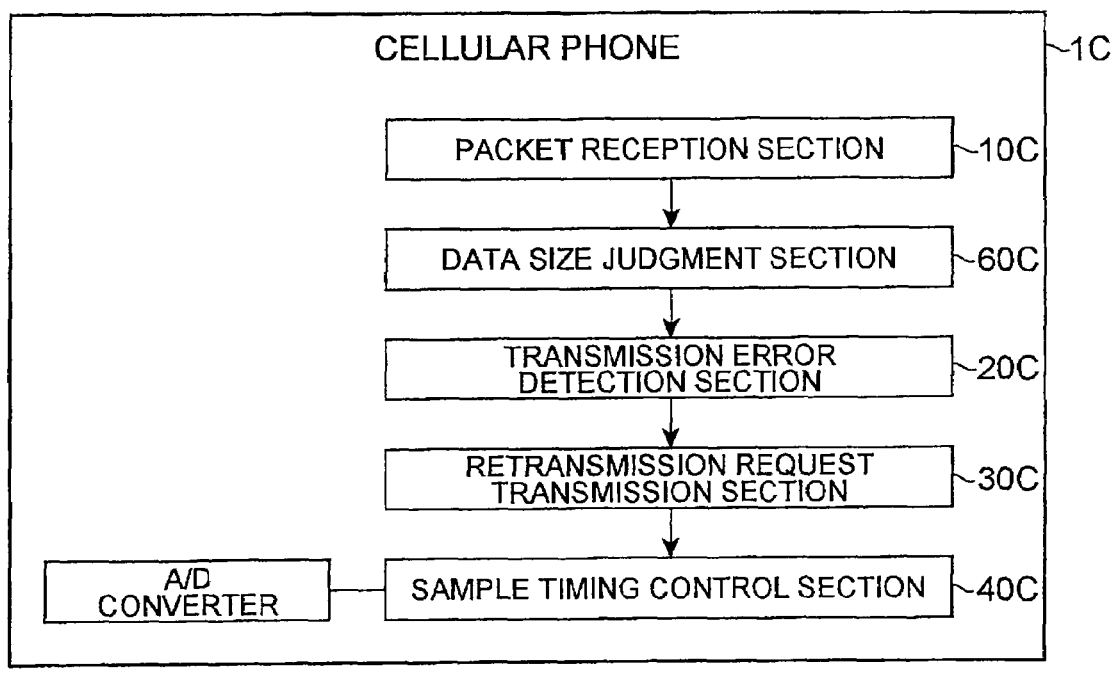
FIG. 6 is a block diagram showing the functional constitution of a cellular phone of a third embodiment.

First, the functional constitution of the cellular phone 1C of the third embodiment will be described with reference to FIG. 6. As shown in FIG. 6, the cellular phone 1C of the third embodiment comprises a packet reception section 10C, a data size judgment section 60C, a transmission error detection section 20C, a retransmission request transmission section 30C, and a sample timing control section 40C. Because the packet reception section 10C, transmission error detection section 20C, and retransmission request transmission section 30C have the same functions as those of the packet reception section 10A, transmission error detection section 20A, and retransmission request transmission section 30A of the first embodiment, the description of these sections will be omitted.

The data size judgment section 60C judges whether the data size of the packet received by the packet reception section 10C exceeds a predetermined threshold value. The threshold value is set on the basis of the relationship between the data size and the reception characteristic and is set between the data size when the reception characteristic is judged to be poor and the data size when the reception characteristic is judged to be favorable, for example. Further, the data size of the packet is included in the control signal relayed by the base station, for example, and the data size judgment section 60C judges whether the data size of the packet exceeds the threshold value on the basis of the control signal relayed by the base station.

The sample timing control section 40C shifts the sample timing of the A/D converter by a half clock when a packet that has been retransmitted in response to a retransmission request is a packet whose data size is judged by the data size judgment section 60C to exceed the threshold value.

Figure 7:
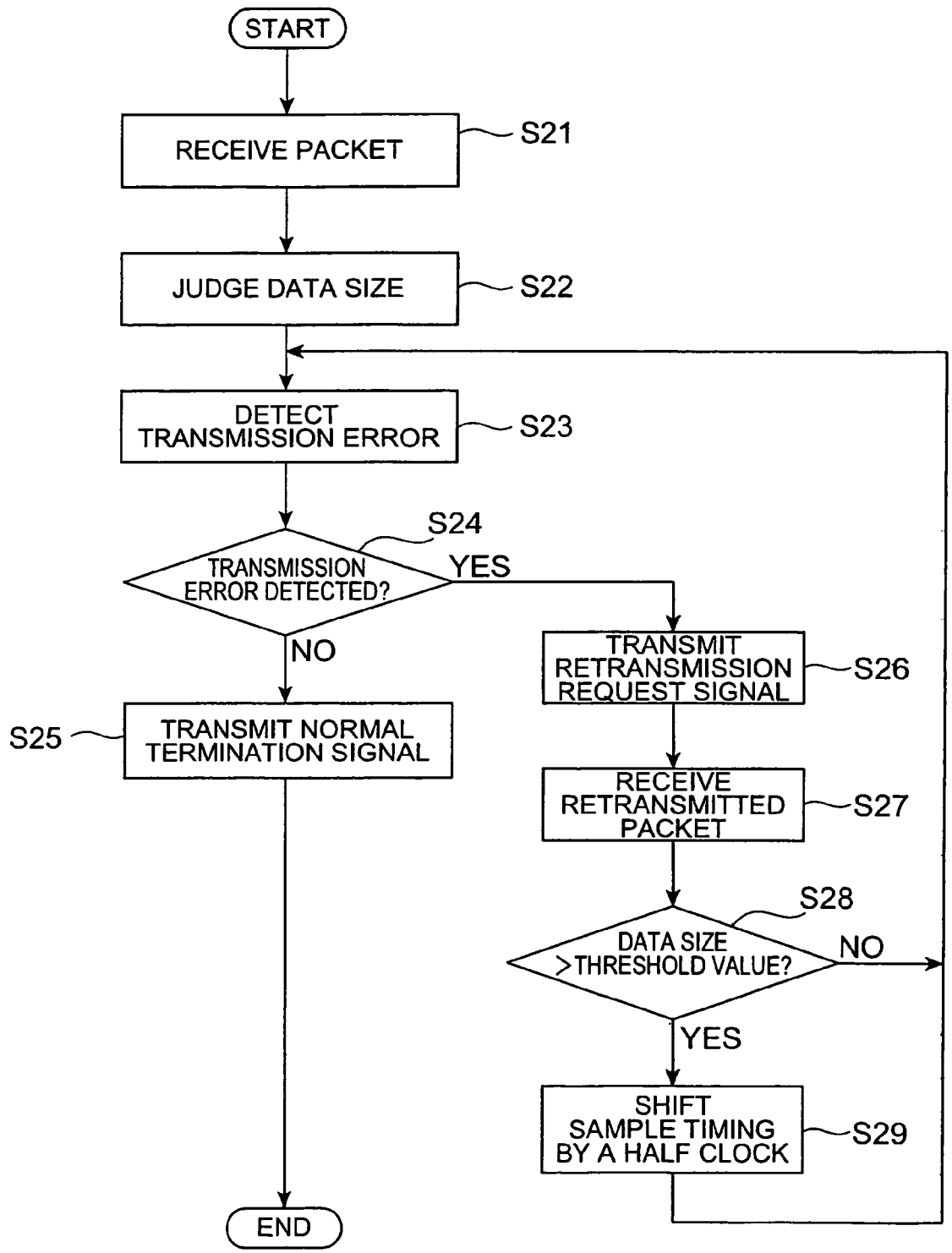
FIG. 7 is a flowchart that serves to illustrate the sample timing control processing of the cellular phone of the third embodiment.

Sample timing control processing for one packet of the cellular phone 1C of the third embodiment will be described next with reference to FIG. 7.

First, the packet reception section 10C of the cellular phone 1C receives a packet that was transmitted by the base station (step S21).

Thereafter, the data size judgment section 60C judges whether the data size of the packet received by the packet reception section 10C exceeds a predetermined threshold value (step S22) and stores the judgment result in the memory of the cellular phone 1C.

Thereafter, the transmission error detection section 20C detects transmission errors of packets received by the packet reception section 10C (step S23) and, when a transmission error is not detected as a result of the detection (step S24; NO), the transmission error detection section 20C transmits a normal termination signal indicating that packet reception was terminated normally to the base station (step S25) and ends the sample timing control processing.

On the other hand, when a transmission error is detected by the transmission error detection section 20C (step S24; YES), the retransmission request transmission section 30C transmits a retransmission request to request retransmission of the packet in which the transmission error is detected to the base station (step S26). As a result, the packet is retransmitted by the base station and the cellular phone 1B receives the retransmitted packet (step S27).

Thereafter, the sample timing control section 40C judges whether the data size of the packet that was retransmitted in response to the retransmission request exceeds the threshold value by referencing the memory (step S28). When the judgment is NO (step S28; NO), the processing moves to step S23.

On the other hand, when it is judged in step S28 that the data size exceeds the threshold value (step S28: YES), the sample timing control section 40C shifts the sample timing of the A/D converter by a half clock (step S29). The processing then moves to step S23.

As a result, when a packet whose data size exceeds the threshold value is retransmitted, the sample timing of the packet can be substantially doubled. Hence, a large-capacity packet is transmitted and, irrespective of the retransmission reception conditions, a reception characteristic similar to that in a case where sampling is performed by doubling the sample timing can be obtained without increasing the sample timing. Hence, the efficiency of the sampling of the A/D converter can be improved while suppressing the power consumption.

Fourth Embodiment

The fourth embodiment of the present invention will be described next. The cellular phone of the fourth embodiment differs from the cellular phone of the first embodiment, as follows. In the case of the cellular phone of the first embodiment, the sample timing is shifted by a half clock when a transmission error is detected and a retransmission request is transmitted. However, the cellular phone of the fourth embodiment differs in that the sample timing is shifted by a half clock when the transmission error rate exceeds a threshold value.

Figure 8:
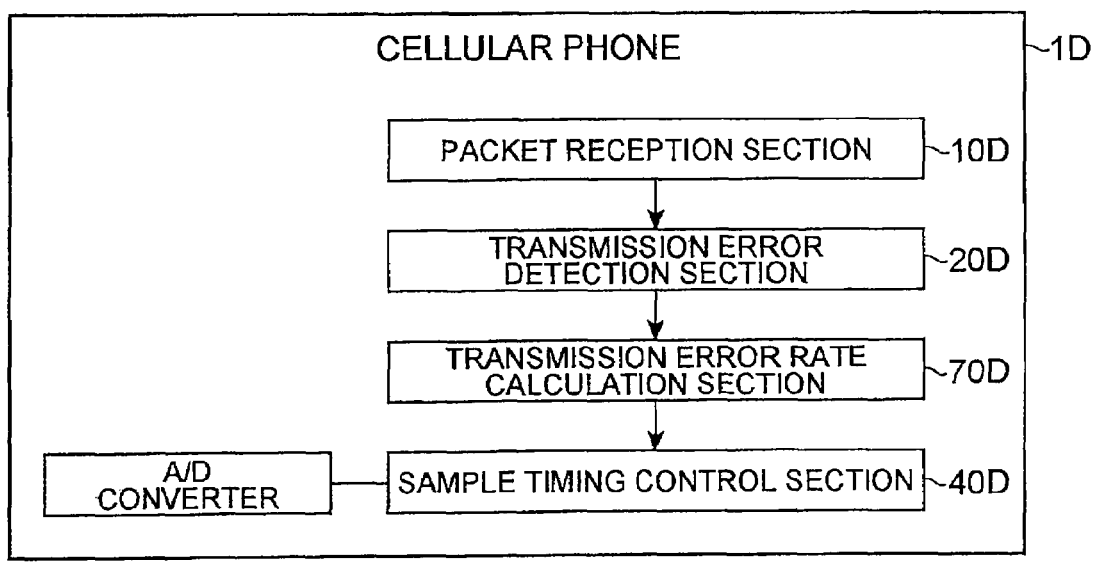
FIG. 8 is a block diagram showing the functional constitution of a cellular phone of a fourth embodiment.

First, the functional constitution of a cellular phone 1D of the fourth embodiment will be described with reference to FIG. 8. As shown in FIG. 8, the cellular phone 1D of the fourth embodiment comprises a packet reception section 10D, a transmission error detection section 20D, a transmission error rate calculation section 70D, and a sample timing control section 40D. Because the packet reception section 10D and transmission error detection section 20D have the same functions as those of the packet reception section 10A and transmission error detection section 20A of the first embodiment, a description of the packet reception section 10D and transmission error detection section 20D will be omitted.

The transmission error rate calculation section 70D calculates the transmission error rate on the basis of the transmission error detection results of the transmission error detection section 20D. As the transmission error rate, a Block Error Rate (BLER) that is calculated on the basis of the number of transmission errors and the number of normal transmissions detected in a predetermined period, for example, can be adopted.

The sample timing control section 40D shifts the sample timing of the A/D converter by a half clock when the transmission error rate calculated by the transmission error rate calculation section 70D exceeds a predetermined threshold value. The threshold value is set on the basis of the relationship between the transmission error rate and the reception characteristic and is set between the transmission error rate when the reception characteristic is judged to be poor and the transmission error rate when the reception characteristic is judged to be favorable, for example.

Figure 9:
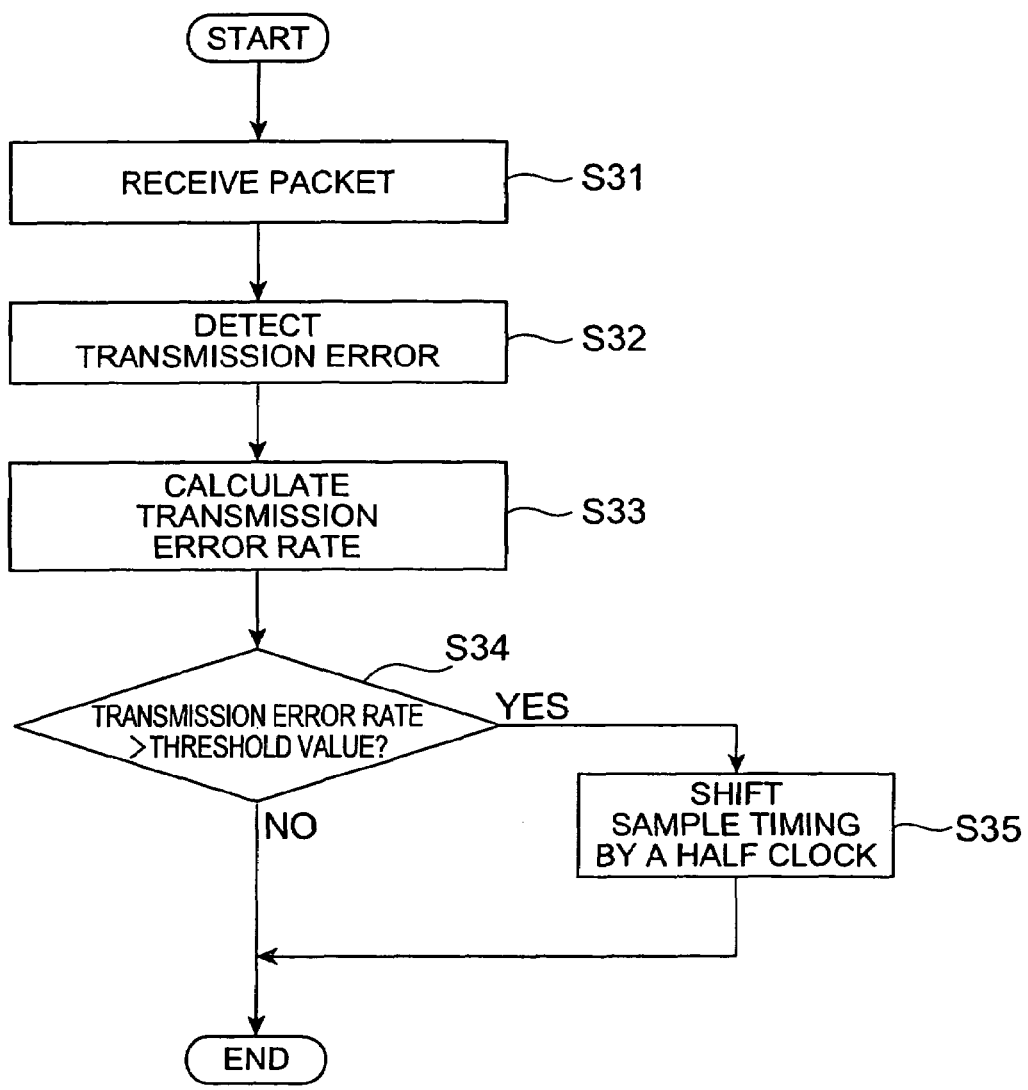
FIG. 9 is a flowchart that serves to illustrate the sample timing control processing of the cellular phone of the fourth embodiment.

The sample timing control processing for one packet of the cellular phone 1D of the fourth embodiment will be described next with reference to FIG. 9.

First, the packet reception section 10D of the cellular phone 1D receives a packet transmitted by the base station (step S31).

Thereafter, the transmission error detection section 20D detects transmission errors in the packet received by the packet reception section 10D (step S32) and stores the detection result in the memory of the cellular phone 1D.

Thereafter, the transmission error rate calculation section 70D calculates the transmission error rate on the basis of the transmission error detection results stored in the memory (step S33).

The sample timing control section 40D then ends the sample timing control processing when it is judged that the transmission error rate calculated by the transmission error rate calculation section 70D is equal to or less than a predetermined threshold value (step S34; NO).

On the other hand, when it is judged that the transmission error rate exceeds a predetermined threshold value (step S34; YES), the sample timing control section 40D shifts the sample timing of the A/D converter by a half clock (step S35) and ends the sample timing control processing.

As a result, because when the transmission error rate exceeds the predetermined threshold value, the sample timing can be shifted by a half clock, when packets are received subsequently, sampling is performed in accordance with the sample timing that has been shifted by a half clock. Therefore, when the transmission error rate has increased owing to the errors generated in the sample timing, for example, the errors in the sample timing can be reduced without increasing the sample timing, and the efficiency of the sampling of the A/D converter can be improved while suppressing the power consumption.

Further, although the sample timing is shifted by a half clock when the transmission errors exceed a threshold value according to the fourth embodiment, the timing for shifting the sample timing is not limited to such a condition. For example, the sample timing may be shifted by a half clock whenever a transmission error is detected without calculating the transmission error rate. The sample timing may also be shifted by a half clock when a predetermined number of consecutive transmission errors are detected.

Further, the functions of the respective embodiments can be suitably combined. For example, the functional constitution of the cellular phone of the third embodiment can be integrated with the functional constitution of the cellular phone of the second embodiment. That is, the data size judgment section 60C of the third embodiment can be integrated with the second embodiment. In this case, the sample timing control section 40B shifts the sample timing of the A/D converter by a half clock when a packet that has been retransmitted in response to a retransmission request is a packet whose modulation system is discriminated by the modulation system discrimination section 50B as 16QAM and is a packet whose data size is judged by the data size judgment section 60C to exceed a predetermined threshold value. As a result, when a packet modulated using 16QAM and with a data size exceeding the threshold value is retransmitted, a reception characteristic similar to that obtained when the sample timing of the retransmitted packet is substantially doubled can be obtained without increasing the sample timing. Therefore, the efficiency of the sampling of the A/D converter can be improved while suppressing the power consumption.

Moreover, although, in each of the embodiments, the description was provided by using a cellular phone as a specific example of the mobile communication terminal, specific examples of the mobile communication terminal are not limited. The mobile communication terminal may be a mobile communication terminal such as a personal handy-phone system (PHS) or a personal digital assistant (PDA) with a communication function. Further, the cellular phone need not necessarily contain a high-speed wireless communication function. However, when a sampling control technology is not adopted in each of the embodiments in cases where the cellular phone contains a high-speed wireless communication function, it is difficult to perform sampling efficiently while suppressing power consumption. This is because QPSK, low rate encoding, and so forth are adopted in currently commercialized W-CDMA systems and, therefore, the effects of errors generated in the sample timing on the reception characteristic are not considered. However, because 16QAM, high-rate encoding, and so forth are applied in HSDPA that is adopted in order to implement high-speed wireless communications, the effect of errors generated in the sample timing on the reception characteristic improves and constitute a major cause of deterioration of the reception characteristic.

The disclosure of Japanese Patent Application No. 2005-071336 filed Mar. 14, 2005 including specification, drawings and claims is incorporated herein by reference in its entirety.

What is claimed is:

1. A mobile communication terminal, comprising:
   receiving means for receiving an analog signal;
   transmission error detecting means for detecting a transmission error of the analog signal received by the receiving means;
   retransmission request transmitting means for, when the transmission error is detected by the transmission error detecting means, transmitting a retransmission request to request retransmission of the analog signal in which the transmission error is detected; and
   sample timing controlling means for controlling a sample timing of an A/D converter for converting the analog signal into a digital signal,
   wherein the sample timing controlling means shifts the sample timing of the A/D converter by a half clock when the retransmission request has been transmitted by the retransmission request transmitting means.

2. A mobile communication terminal, comprising:
   receiving means for receiving an analog signal;
   modulation system discriminating means for determining a modulation system of the analog signal received by the receiving means;
   transmission error detecting means for detecting a transmission error of the analog signal received by the receiving means;
   retransmission request transmitting means for, when the transmission error is detected by the transmission error detecting means, transmitting a retransmission request to request retransmission of the analog signal in which the transmission error is detected; and
   sample timing controlling means for controlling a sample timing of an A/D converter for converting the analog signal into a digital signal,
   wherein the sample timing controlling means shifts the sample timing of the A/D converter by a half clock when the analog signal retransmitted in response to the retransmission request is an analog signal of which the modulation system is determined as quadrature amplitude modulation by the modulation system discriminating means.

3. A mobile communication terminal, comprising:
   receiving means for receiving an analog signal;
   data size judging means for judging whether a data size of the analog signal received by the receiving means exceeds a predetermined threshold value;
   transmission error detecting means for detecting a transmission error of the analog signal received by the receiving means;
   retransmission request transmitting means for, when the transmission error is detected by the transmission error detecting means, transmitting a retransmission request to request retransmission of the analog signal in which the transmission error is detected; and
   sample timing controlling means for controlling a sample timing of an A/D converter for converting the analog signal into a digital signal,
   wherein the sample timing controlling means shifts the sample timing of the A/D converter by a half clock when the analog signal retransmitted in response to the retransmission request is an analog signal of which the data size is judged to exceed the predetermined threshold value by the data size judging means.

4. A mobile communication terminal, comprising:
   receiving means for receiving an analog signal;
   modulation system discriminating means for determining a modulation system of the analog signal received by the receiving means;
   data size judging means for judging whether a data size of the analog signal received by the receiving means exceeds a predetermined threshold value;
   transmission error detecting means for detecting a transmission error of the analog signal received by the receiving means;
   retransmission request transmitting means for, when the transmission error is detected by the transmission error detecting means, transmitting a retransmission request to request retransmission of the analog signal in which the transmission error is detected; and
   sample timing controlling means for controlling a sample timing of an A/D converter for converting the analog signal into a digital signal,
   wherein the sample timing controlling means shifts the sample timing of the A/D converter by a half clock when the analog signal retransmitted in response to the retransmission request is an analog signal of which the modulation system is determined as quadrature amplitude modulation by the modulation system discriminating means and is an analog signal of which the data size is judged to exceed the predetermined threshold value by the data size judging means.

5. The mobile communication terminal according to claim 1, wherein the sample timing controlling means shifts the sample timing of the A/D converter by a half clock when the transmission error is detected a predetermined number of consecutive times.

6. The mobile communication terminal according to claim 1, further comprising:
   transmission error rate calculating means for calculating a transmission error rate on the basis of the result of transmission error detection by the transmission error detecting means,
   wherein the sample timing controlling means shifts the sample timing of the A/D converter by a half clock when the transmission error rate calculated by the transmission error rate calculating means exceeds a predetermined threshold value.

* * * * *